United States Patent
You et al.

(10) Patent No.: US 9,349,979 B2
(45) Date of Patent: May 24, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-do (KR)

(72) Inventors: Chun-Gi You, Yongin (KR); Joon-Hoo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/831,582

(22) Filed: Mar. 15, 2013

(65) Prior Publication Data

US 2014/0027736 A1  Jan. 30, 2014

(30) Foreign Application Priority Data

Jul. 30, 2012  (KR) .......................... 10-2012-0083515

(51) Int. Cl.

| | | |
|---|---|---|
| *H01L 51/52* | (2006.01) | |
| *H01L 27/32* | (2006.01) | |
| *H01L 29/417* | (2006.01) | |
| *H01L 27/12* | (2006.01) | |

(52) U.S. Cl.
CPC .......... *H01L 51/5203* (2013.01); *H01L 27/124* (2013.01); *H01L 27/1259* (2013.01); *H01L 27/3262* (2013.01); *H01L 29/41733* (2013.01)

(58) Field of Classification Search
CPC ...................... H01L 29/41733; H01L 51/5203; H01L 21/823475; H01L 27/3262; H01L 27/124; H01L 27/1259

USPC .......... 438/622, 613; 257/E51.003, E51.018, 257/59

See application file for complete search history.

(56) References Cited

U.S. PATENT DOCUMENTS

| | | | |
|---|---|---|---|
| 6,255,695 B1* | 7/2001 | Kubota et al. ................. | 257/351 |
| 7,800,235 B2* | 9/2010 | Zhang ........................... | 257/775 |
| 7,985,992 B2* | 7/2011 | Kang et al. .................... | 257/288 |
| 2003/0141811 A1 | 7/2003 | Park et al. | |
| 2004/0041147 A1* | 3/2004 | Park ............................... | 257/40 |
| 2004/0082195 A1* | 4/2004 | Yudasaka et al. ............. | 438/782 |
| 2004/0256619 A1* | 12/2004 | Nomura et al. ................. | 257/66 |

(Continued)

FOREIGN PATENT DOCUMENTS

| | | |
|---|---|---|
| KR | 10-0426031 | 4/2004 |
| KR | 10-0442898 | 12/2004 |

(Continued)

*Primary Examiner* — Latanya N Crawford
(74) *Attorney, Agent, or Firm* — Lewis Roca Rothgerber Christie LLP

(57) ABSTRACT

An organic light-emitting display device and a method of manufacturing the same. The organic light-emitting display device includes: a substrate; an active layer on the substrate; a gate electrode insulated from the active layer and overlapping the active layer; a source electrode including a first source electrode layer connected to the active layer and a second source electrode layer connected to the first source electrode layer and being larger than the first source electrode layer; a drain electrode including a first drain electrode layer connected to the active layer and a second drain electrode layer connected to the first drain electrode layer and being larger than the first drain electrode layer; a first electrode electrically connected to the source electrode or the drain electrode; an intermediate layer on the first electrode and including an organic emission layer; and a second electrode on the intermediate layer.

24 Claims, 5 Drawing Sheets

(56) References Cited

U.S. PATENT DOCUMENTS

| | | |
|---|---|---|
| 2005/0007535 A1 | 1/2005 | Hirakata et al. |
| 2005/0116232 A1* | 6/2005 | Kim et al. .................. 257/72 |
| 2005/0189874 A1* | 9/2005 | Park et al. ................. 313/504 |
| 2006/0091399 A1* | 5/2006 | Lee ............................. 257/72 |
| 2007/0238227 A1* | 10/2007 | Jun et al. .................... 438/149 |
| 2008/0067514 A1* | 3/2008 | Park et al. ................... 257/64 |
| 2008/0237585 A1 | 10/2008 | Kim |
| 2011/0001192 A1* | 1/2011 | Zhang ........................ 257/347 |
| 2011/0025585 A1 | 2/2011 | Kim et al. |
| 2011/0164019 A1 | 7/2011 | Son |
| 2012/0074413 A1 | 3/2012 | Kim |

FOREIGN PATENT DOCUMENTS

| | | |
|---|---|---|
| KR | 10-2007-0068092 A | 6/2007 |
| KR | 10-2008-0088083 | 10/2008 |
| KR | 10-2009-0120698 A | 11/2009 |
| KR | 10-2011-0012710 | 2/2011 |
| KR | 10-2011-0070607 A | 6/2011 |
| KR | 10-2011-0080905 | 7/2011 |
| KR | 10-2012-0032906 | 4/2012 |

\* cited by examiner

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0083515, filed on Jul. 30, 2012, in the Korean Intellectual Property Office, the disclosure of which is incorporated herein in its entirety by reference.

BACKGROUND

1. Field

One or more embodiments of the present invention relate to an organic light-emitting display device, and more particularly, to an organic light-emitting display device that may improve a display quality and a method of manufacturing the same.

2. Description of the Related Art

Display devices are being replaced with flat display devices that are portable and thin. Among flat display devices, organic light-emitting display devices have drawn attention as next generation display devices because they have self light-emitting characteristics and superior characteristics such as wide viewing angles, high contrast ratios, and short response times.

An organic light-emitting display device includes an intermediate layer, a first electrode, and a second electrode. The intermediate layer includes an organic emission layer, and when voltages are applied to the first and second electrodes, visible light is emitted from the organic emission layer.

The organic light-emitting display device may further include a thin film transistor for operating the organic light-emitting display device. The thin film transistor includes an active layer, a gate electrode, a source electrode, and a drain electrode.

In this case, when the thin film transistor is formed, an insulating layer is disposed between thin layers of the thin film transistor. For example, an insulating layer may be disposed between the source and gate electrodes and between the drain and gate electrodes.

When the insulating layer is formed, a short-circuit may still occur between elements to be insulated by the insulating layer such as between the gate electrode and the source electrode or between the gate electrode and the drain electrode due to particles penetrating the insulating layer or morphology of elements formed under the insulating layer such as the gate electrode. In particular, when an organic light-emitting display device having high resolution is manufactured, a line width of wirings and a distance between wirings are decreased. Thus, the above defects occur frequently, and there is a limitation in improving a display quality of the organic light-emitting display device.

SUMMARY

Aspects of one or more embodiments of the present invention are directed toward an organic light-emitting display device that may improve a display quality and a method of manufacturing the organic light-emitting display device.

According to an embodiment of the present invention, there is provided an organic light-emitting display device including: a substrate; an active layer formed on the substrate; a gate electrode that is insulated from the active layer and overlaps the active layer; a source electrode including a first source electrode layer that is connected to the active layer and a second source electrode layer that is connected to the first source electrode layer and that is larger than the first source electrode layer; a drain electrode including a first drain electrode layer that is connected to the active layer and a second drain electrode layer that is connected to the first drain electrode layer and that is larger than the first drain electrode layer; a first electrode that is electrically connected to the source electrode or the drain electrode; an intermediate layer that is disposed on the first electrode and includes an organic emission layer; and a second electrode disposed on the intermediate layer.

The organic light-emitting display device may further include: a first interlayer insulating layer that is formed on the gate electrode and includes a first contact hole; and a second interlayer insulating layer that is formed on the first interlayer insulating layer and includes a second contact hole.

The first source electrode layer and the first drain electrode layer may be formed to correspond to the first contact hole, and the second source electrode layer and the second drain electrode layer may be formed to correspond to the second contact hole.

The first contact hole may have a size smaller than that of the second contact hole.

A plurality of the first contact holes may be formed to be connected to the same second contact hole.

The first interlayer insulating layer may include an inorganic material, and the second interlayer insulating layer may include an organic material.

A top surface of the second interlayer insulating layer may be planarized.

The organic light-emitting display device may further include a storage area that is defined on the substrate, and a capacitor that is formed in the storage area and includes a first capacitor electrode and a second capacitor electrode.

The organic light-emitting display device may further include: a first interlayer insulating layer formed on the gate electrode; and a second interlayer insulating layer formed on the first interlayer insulating layer, wherein each of the first interlayer insulating layer and the second interlayer insulating layer includes an opening corresponding to the capacitor.

The organic light-emitting display device may further include a power supply wiring formed above the capacitor so as to overlap the capacitor.

At least one insulating layer may be disposed between the capacitor and the power supply wiring.

The organic light-emitting display device may further include: a first interlayer insulating layer formed on the gate electrode; and a second interlayer insulating layer formed on the first interlayer insulating layer, wherein the first interlayer insulating layer and the second interlayer insulating layer are disposed between the capacitor and the power supply wiring.

The organic light-emitting display device may further include a data wiring formed above the capacitor so as to overlap the capacitor.

At least one insulating layer may be disposed between the capacitor and the data wiring.

The organic light-emitting display device may further include: a first interlayer insulating layer formed on the gate electrode; and a second interlayer insulating layer formed on the first interlayer insulating layer, wherein the first interlayer insulating layer and the second interlayer insulating layer are disposed between the capacitor and the data wiring.

The organic light-emitting display device may further include a power supply wiring and a data wiring that are formed above the capacitor so as to overlap the capacitor, wherein the power supply wiring and the data wiring are formed as different layers so as to overlap each other.

The organic light-emitting display device may further include: a first interlayer insulating layer formed on the gate electrode; and a second interlayer insulating layer formed on the first interlayer insulating layer, wherein the power supply wiring is formed on the first interlayer insulating layer, and the data wiring is formed on the second interlayer insulating layer.

The organic light-emitting display device may further include: a first interlayer insulating layer formed on the gate electrode; and a second interlayer insulating layer formed on the first interlayer insulating layer, wherein the data wiring is formed on the first interlayer insulating layer, and the power supply wiring is formed on the second interlayer insulating layer.

The first capacitor electrode may be formed on the same layer as the active layer, and the second capacitor electrode may be formed on the same layer as the gate electrode.

The first electrode may include ITO, IZO, ZnO, $In_2O_3$, IGO, or AZO.

The first electrode may be formed on the same layer as the gate electrode.

The gate electrode may include a first conductive layer and a second conductive layer formed on the first conductive layer, and the first electrode may be formed on the same layer as the first conductive layer by using the same material used in forming the first conductive layer.

According to another embodiment of the present invention, there is provided a method of manufacturing an organic light-emitting display device, the method including: forming an active layer on a substrate; forming a gate electrode that is insulated from the active layer and overlaps the active layer; forming a source electrode including a first source electrode layer that is connected to the active layer and a second source electrode layer that is connected to the first source electrode layer and that is larger than the first source electrode layer; forming a drain electrode including a first drain electrode layer that is connected to the active layer and a second drain electrode layer that is connected to the first drain electrode layer and that is larger than the first drain electrode layer; forming a first electrode that is electrically connected to the source electrode or the drain electrode; forming an intermediate layer that is disposed on the first electrode and includes an organic emission layer; and forming a second electrode disposed on the intermediate layer.

The method may further include: forming a first interlayer insulating layer on the gate electrode, wherein the first interlayer insulating layer includes a first contact hole; and forming a second interlayer insulating layer on the first interlayer insulating layer, wherein the second interlayer insulating layer includes a second contact hole.

Each of the forming of the source electrode and the forming of the drain electrode may include forming the first source electrode layer and the first drain electrode layer so as to correspond to the first contact hole and forming the second source electrode layer and the second drain electrode layer so as to correspond to the second contact hole.

Each of the forming of the source electrode and the forming of the drain electrode may include simultaneously or concurrently forming the first source electrode layer, the first drain electrode layer, the second source electrode layer, and the second drain electrode layer after the forming of the first interlayer insulating layer and the forming of the second interlayer insulating layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

A structure and an operation of the present invention will now be described more fully with reference to the accompanying drawings, in which exemplary embodiments of the invention are shown.

Figure 1:
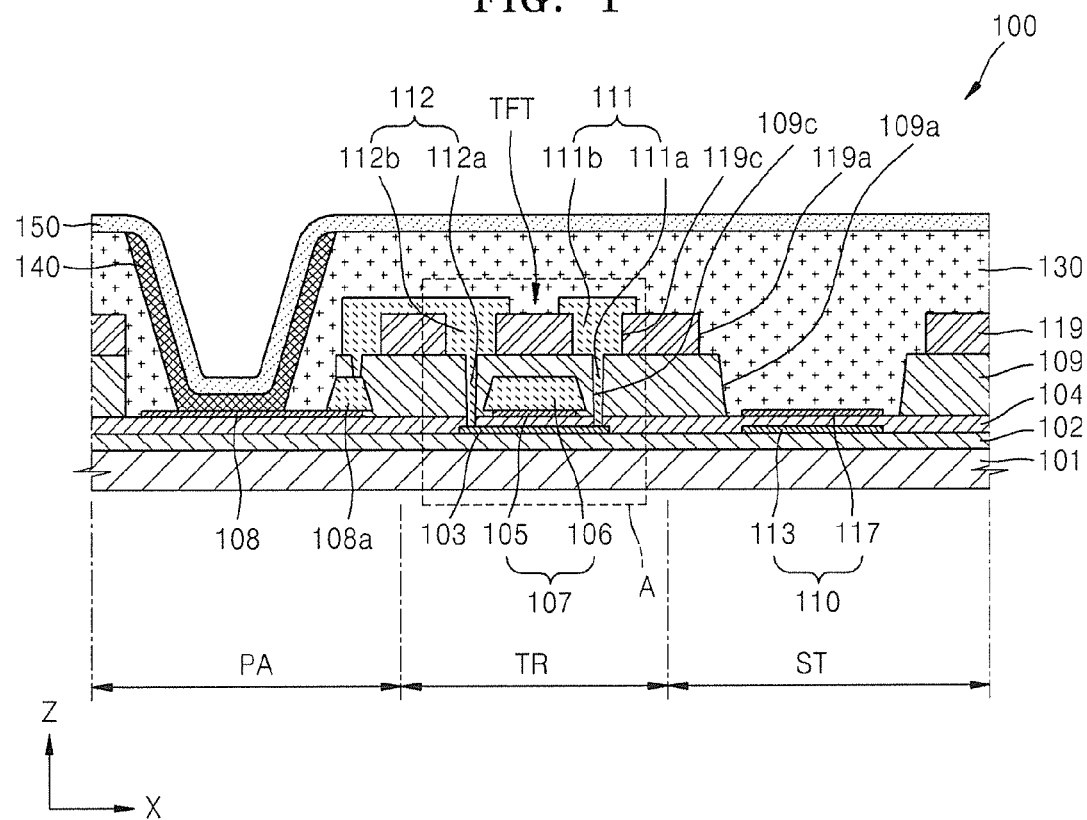
FIG. 1 is a schematic cross-sectional view of an organic light-emitting display device according to an embodiment of the present invention.

FIG. 1 is a schematic cross-sectional view of an organic light-emitting display device 100 according to an embodiment of the present invention.

Referring to FIG. 1, the organic light-emitting display device 100 according to the present embodiment includes a substrate 101, a buffer layer 102, a first electrode 108, a thin film transistor TFT, an intermediate layer 140, a second electrode 150, a first interlayer insulating layer 109, a second interlayer insulating layer 119, and a capacitor 110.

The substrate 101 is defined by a plurality of areas, which include an emission area PA, a circuit area TR, and a storage area ST.

The emission area PA is an area which overlaps at least the intermediate layer 140 and in which visible light is emitted from the intermediate layer 140. The circuit area TR is an area in which various electrical signals for performing an operation in the emission area PA are transmitted and the thin film transistor TFT is disposed.

The thin film transistor TFT includes an active layer 103, a gate electrode 107, a source electrode 111, and a drain electrode 112. In addition, the source electrode 111 includes a first source electrode layer 111a and a second source electrode layer 111b, and the drain electrode 112 includes a first drain electrode layer 112a and a second drain electrode layer 112b.

The capacitor 110 is disposed in the storage area ST and includes a first capacitor electrode 113 and a second capacitor electrode 117.

Configuration of elements will now be described in more detail.

The substrate 101 may be formed of a transparent glass material containing $SiO_2$ as a main component. However, aspects of the present invention are not limited thereto, and the substrate 101 may also be formed of a transparent plastic material. In this case, the transparent plastic material for forming the substrate 101 may be at least one selected from various suitable organic materials.

The buffer layer 102 is formed on the substrate 101. The buffer layer 102 prevents or blocks impure elements from penetrating into the substrate 101 and planarizes an upper portion of the substrate 101. Thus, the buffer layer 102 may be formed of various suitable materials having such functions. For example, the buffer layer 102 may include an inorganic material, such as silicon oxide, silicon nitride, silicon oxynitride, aluminum oxide, aluminum nitride, titanium oxide, or titanium nitride, and/or an organic material, such as polyimide, polyester, or acryl. The buffer layer 102 may have a stack structure in which a plurality of the materials are deposited.

Also, the buffer layer 102 is not an essential element and thus may be omitted according process conditions.

The active layer 103 and the first capacitor electrode 113 are formed on the buffer layer 102. The active layer 103 and the first capacitor electrode 113 may be formed of the same material. The active layer 103 and the first capacitor electrode 113 include a semiconductor material, for example, silicon.

A gate insulating layer 104 is formed on the buffer layer 102 so as to cover the active layer 103 and the first capacitor electrode 113.

The gate electrode 107, the first electrode 108, and the second capacitor electrode 117 are formed on the gate insulating layer 104.

The gate electrode 107 includes a first conductive layer 105 and a second conductive layer 106. The first conductive layer 105 includes a transmission conductive material, and for example, the first conductive layer 105 may be formed of ITO, IZO, ZnO, $In_2O_3$, IGO, or AZO.

The second conductive layer 106 may be formed on the first conductive layer 105 with metal or a metal alloy, such as Mo, MoW, or an Al-based alloy. However, aspects of the present invention are not limited thereto, and the second conductive layer 106 may also include a stack structure of Mo/Al/Mo.

The first electrode 108 includes a transmission conductive material and may be formed of the same material used in forming the first conductive layer 105. A conductive portion 108a is disposed in a set or predetermined upper region of the first electrode 108. in one embodiment, the conductive portion 108a is formed of the same material used in forming the second conductive layer 106.

The second capacitor electrode 117 may be formed of the same material used in forming the first conductive layer 105.

The first interlayer insulating layer 109 is formed on the first electrode 108, the gate electrode 107, and the second capacitor electrode 117. The first interlayer insulating layer 109 may include various suitable insulating materials, for example, inorganic materials.

The first interlayer insulating layer 109 includes a first contact hole 109c.

Also, the first interlayer insulating layer 109 is formed not to cover at least one region of a top surface of the second capacitor electrode 117. In more detail, the first interlayer insulating layer 109 may include an opening 109a that overlaps the top surface of the second capacitor electrode 117.

Also, the first interlayer insulating layer 109 is formed not to cover a set or predetermined region of a top surface of the first electrode 108.

The first source electrode layer 111a of the source electrode 111 and the first drain electrode layer 112a of the drain electrode 112 are formed to correspond to a first contact hole 109c of the first interlayer insulating layer 109.

The first source electrode layer 111a and the first drain electrode layer 112a are formed to be connected to the active layer 103. The first source electrode layer 111a and the first drain electrode layer 112a may be formed using various suitable materials. For example, the first source electrode layer 111a and the first drain electrode layer 112a may be formed of metal, such as Au, Pd, Pt, Ni, Rh, Ru, Ir, Os, Al, Mo, Nd, Mo, or W, or an alloy including two or more materials among the materials. However, aspects of the present invention are not limited thereto.

The second interlayer insulating layer 119 is formed on the first interlayer insulating layer 109. The second interlayer insulating layer 119 may include various suitable insulating materials, for example, organic materials.

The second interlayer insulating layer 119 includes a second contact hole 119c.

Also, the second interlayer insulating layer 119 is formed not to cover at least one region of the top surface of the second capacitor electrode 117. In detail, the second interlayer insulating layer 119 may include an opening 119a that overlaps the top surface of the second capacitor electrode 117.

Also, the second interlayer insulating layer 119 is formed not to cover a set or predetermined region of the top surface of the first electrode 108.

The second source electrode layer 111b of the source electrode 111 and the second drain electrode layer 112b of the drain electrode 112 are formed to correspond to the second contact hole 119c of the second interlayer insulating layer 119.

The second source electrode layer 111b is connected to the first source electrode layer 111a, and the second drain electrode layer 112b is connected to the first drain electrode layer 112a. The second source electrode layer 111b and the second drain electrode layer 112b may be formed of various suitable materials. For example, the second source electrode layer 111b and the second drain electrode layer 112b may be formed of metal, such as Au, Pd, Pt, Ni, Rh, Ru, Ir, Os, Al, Mo, Nd, Mo, or W, or an alloy including two or more materials among the materials. However, aspects of the present invention are not limited thereto.

Figure 2:
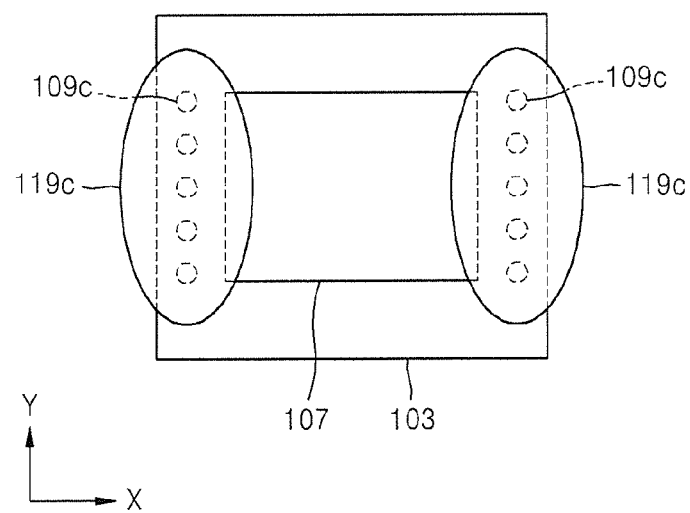
FIG. 2 is a plan view of portion A of FIG. 1 in detail.

The first source electrode layer 111a of the source electrode 111 is formed smaller than the second source electrode layer 111b. In detail, the first contact hole 109c of the first interlayer insulating layer 109 is formed smaller than the second contact hole 119c of the second interlayer insulating layer 119, and the first source electrode layer 111a is formed to correspond to the first contact hole 109c, and the second source electrode layer 111b is formed to correspond to the second contact hole 119c. Also, as illustrated in FIG. 2, a plurality of first contact holes 109c are formed to be connected to one second contact hole 119c so that a plurality of first source electrode layers 111a are formed to be connected to the second source electrode layer 111b.

The first drain electrode layer 112a of the drain electrode 112 is formed smaller than the second drain electrode layer 112b. In detail, the first contact hole 109c of the first interlayer insulating layer 109 is formed smaller than the second contact hole 119c of the second interlayer insulating layer 119, and the first drain electrode layer 112a is formed to correspond to the first contact hole 109c, and the second drain electrode layer 112b is formed to correspond to the second contact hole 119c of the second drain electrode layer 112b. Also, as illustrated in FIG. 2, a plurality of first contact holes 109c are formed to be connected to one second contact hole 119c so that a plurality of first drain electrode layers 112a are formed to be connected to the second drain electrode layer 112b.

As a result, in the present embodiment, two interlayer insulating layers 109 and 119 are formed between the gate electrode 107, the second source electrode layer 111b, and the second drain electrode layer 112b so that a foreign substance may be effectively prevented from being generated between the gate electrode 107, the second source electrode layer 111b, and the second drain electrode layer 112b or a short-circuit may be effectively prevented from occurring between the gate electrode 107, the second source electrode layer 111*b*, and the second drain electrode layer 112*b* due to metal components that remain when the gate electrode 107, the second source electrode layer 111*b*, and the second drain electrode layer 112*b* are formed.

In particular, the first interlayer insulating layer 109, containing an inorganic material having an excellent capability for preventing moisture penetration and an excellent step coverage characteristic, is first formed on the gate electrode layer 107 so that the gate electrode 107 may be effectively insulated from the active layer 103 by the first interlayer insulating layer 109. Also, since the second interlayer insulating layer 119 is formed on the first interlayer insulating layer 109 by using an organic material, the second interlayer insulating layer 119 may be easily formed to a desired thickness, and a top surface of the second interlayer insulating layer 119 is planarized so that the second interlayer insulating layer 119 may easily function as a planarization layer.

In this case, the first contact hole 109*c* of the first interlayer insulating layer 109 is formed to have a small size so that a distance between the source electrode 111 and the drain electrode 112 and a distance between other wirings are minimized (or can be reduced) so as to easily implement the organic light-emitting display device 100 having high resolution. In addition, the second contact hole 119*c* of the second interlayer insulating layer 119 is formed larger than the first contact hole 109*c* so that electrical characteristics of the thin film transistor TFT may be improved.

In particular, a plurality of first contact holes 109*c* are formed to be connected to one second contact hole 119*c* so that an electrical contact characteristic between the first source electrode layer 111*a* and the active layer 103 and an electrical contact characteristic between the first drain electrode layer 112*a* and the active layer 103 may be easily improved.

Also, one of the source electrode 111 and the drain electrode 112 is electrically connected to the first electrode 108. FIG. 1 illustrates that the second drain electrode layer 112*b* of the drain electrode 112 is electrically connected to the first electrode 108. In detail, the drain electrode 112 contacts the conductive portion 108*a* and thus is electrically connected to the first electrode 108.

A pixel-defining layer (PDL) 130 is formed on the second interlayer insulating layer 119 so as to cover the second source electrode layer 111*b* of the source electrode 111, the second drain electrode layer 112*b* of the drain electrode 112, and the second capacitor electrode 117. The PDL 130 is formed not to cover at least one region of the top surface of the first electrode 108.

The intermediate layer 140 is formed on the first electrode 108. In more detail, the intermediate layer 140 is formed so as to contact the top surface of the first electrode 108 that is not covered by the PDL 130.

The intermediate layer 140 includes an organic emission layer so as to emit visible light.

The intermediate layer 140 may be a low-molecular weight organic layer or a polymer organic layer. When the intermediate layer 140 is a low-molecular weight organic layer, the intermediate layer 140 may include a hole injection layer (HIL), a hole transport layer (HTL), an organic emission layer, an electron transport layer (ETL), and an electron injection layer (EIL).

The HIL may be formed of a phthalocyanine compound such as copper phthalocyanine (CuPc) or a starburst-type amine derivative such as TCTA, m-MTDATA, or m-MTDAPB.

The HTL may be formed of N,N'-bis(3-methylphenyl)-N,N'-diphenyl-[1,1-biphenyl]-4,4'-diamine (TPD),N,N'-di(naphthalene-1-yl)-N,N'-diphenyl-benzidine ($\alpha$-NPD), or the like.

The EIL may be formed of material, such as LiF, NaCl, CsF, $Li_2O$, BaO, or Liq.

The ETL may be formed using tris-8-hydroxyquinoline aluminum (Alq3).

The organic emission layer may include a host material and a dopant material.

The second electrode 150 is formed on the intermediate layer 140. The second electrode 150 may be formed of metal, such as Ag, Mg, Al, Pt, Pd, Au, Ni, Nd, Ir, Cr, Li, or Ca. In addition, the second electrode 150 may include ITO, IZO, ZnO, or $In_2O_3$ that is a light-transmitting material.

In addition, an encapsulation member may be formed on the second electrode 150. The encapsulation member may be formed of an organic and/or inorganic material.

In the organic light-emitting display device 100 according to the present embodiment, two interlayer insulating layers 109 and 119 are formed between the gate electrode 107, the second source electrode layer 111*b*, and the second drain electrode layer 112*b* so that a short-circuit may be effectively prevented from occurring between the gate electrode 107, the second source electrode layer 111*b*, and the second drain electrode layer 112*b*. Thus, defects in a display quality of the organic light-emitting display device 100 are improved so as to improve a display quality of the organic light-emitting display device 100.

In particular, the first contact hole 109*c* of the first interlayer insulating layer 109 is formed to have a small size so that a distance between the source electrode 111 and the drain electrode 112 and a distance between other wirings are minimized (or can be reduced) so as to easily implement the organic light-emitting display device 100 having high resolution. In addition, the second contact hole 119*c* of the second interlayer insulating layer 119 is formed larger than the first contact hole 109*c* so that electrical characteristics of the thin film transistor TFT may be improved.

In this case, a plurality of first contact holes 109*c* are formed to be connected to one second contact hole 119*c* so that an electrical contact characteristic between the first source electrode layer 111*a* and the active layer 103 and an electrical contact characteristic between the first drain electrode layer 112*a* and the active layer 103 may be easily improved.

FIGS. 3A through 3F are schematic cross-sectional views sequentially illustrating a method of manufacturing an organic light-emitting display device, according to an embodiment of the present invention.

In detail, FIGS. 3A through 3F illustrate an embodiment of a method of manufacturing the organic light-emitting display device 100 of FIG. 1. For convenience of explanation, only differences between FIGS. 1 and 2 and FIGS. 3A through 3F are described below.

Figure 3A:
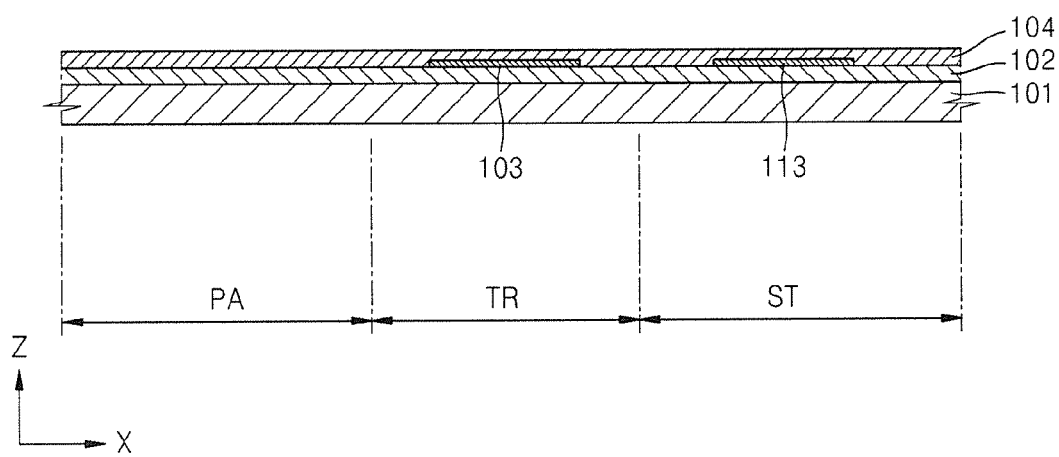
FIGS. 3A through 3F are schematic cross-sectional views sequentially illustrating a method of manufacturing an organic light-emitting display device, according to an embodiment of the present invention.

First, referring to FIG. 3A, a substrate 101 is prepared. A buffer layer 102 is formed on the substrate 101.

An active layer 103 and a first capacitor electrode 113 are formed on the buffer layer 102. The first capacitor electrode 113 and the active layer 103 may be formed of the same material. In addition, the active layer 103 and the first capacitor electrode 113 may be simultaneously or concurrently formed by performing a patterning process using one mask.

Figure 3B:
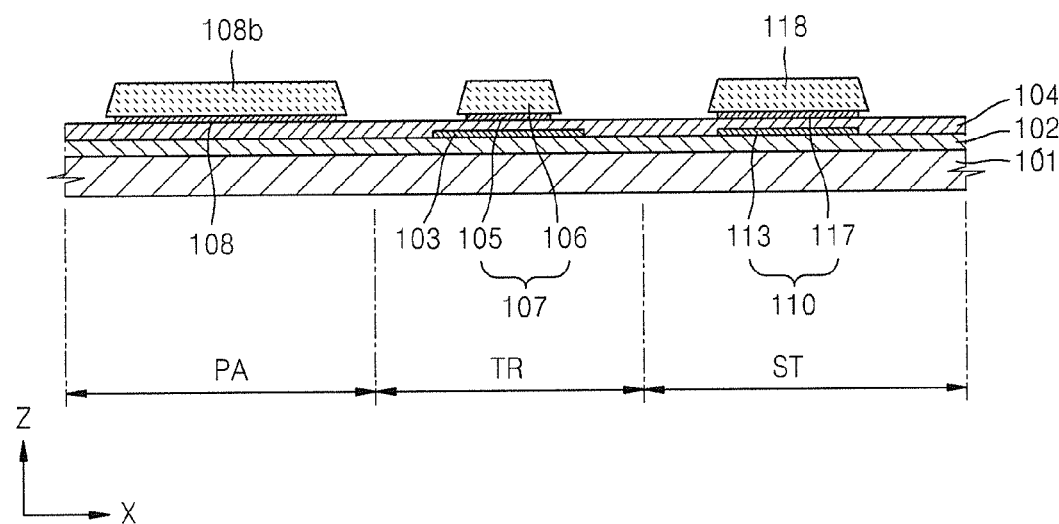

Thus, referring to FIG. 3B, a gate insulating layer 104 is formed on the buffer layer 102 so as to cover the active layer 103 and the first capacitor electrode 113, and a gate electrode 107, a first electrode 108, and a second capacitor electrode 117 are formed on the gate insulating layer 104.

The gate electrode 107 includes a first conductive layer 105 and a second conductive layer 106. The first electrode 108 may be formed of the same material used in forming the first conductive layer 105. A conductive layer 108b is disposed on the first electrode 108 and is formed of the same material used in forming the second conductive layer 106.

The second capacitor electrode 117 may be formed of the same material used in forming the first conductive layer 105. A cover layer 118 is formed on the second capacitor electrode 117. The cover layer 118 is formed of the same material used in forming the second conductive layer 106 of the gate electrode 107. The gate electrode 107, the first electrode 108, the conductive layer 108b, the second capacitor electrode 117, and the cover layer 118 may be formed by performing a patterning process using one mask.

Figure 3C:
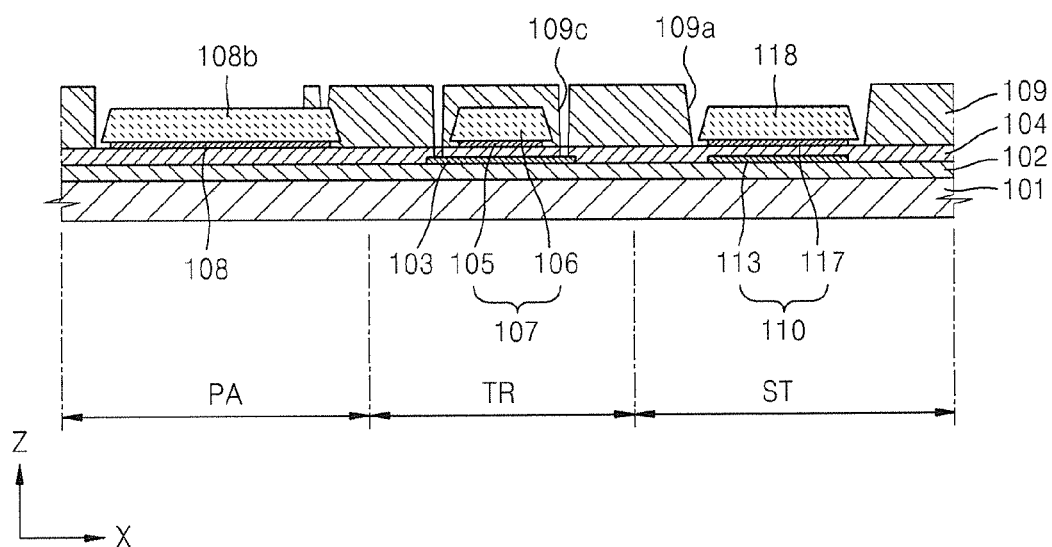

Next, referring to FIG. 3C, a first interlayer insulating layer 109 is formed on the conductive layer 108b and the gate electrode 107. The first interlayer insulating layer 109 includes a first contact hole 109c corresponding to the active layer 103. Although not shown in FIG. 3C, a plurality of first contact holes 109c are formed to correspond to one region of the active layer 103 based on the gate electrode 107, as illustrated in FIG. 2.

In addition, the first interlayer insulating layer 109 includes an opening 109a corresponding to the cover layer 118. The first interlayer insulating layer 109 is formed to expose a set or predetermined area of a top surface of the conductive layer 108b.

Figure 3D:
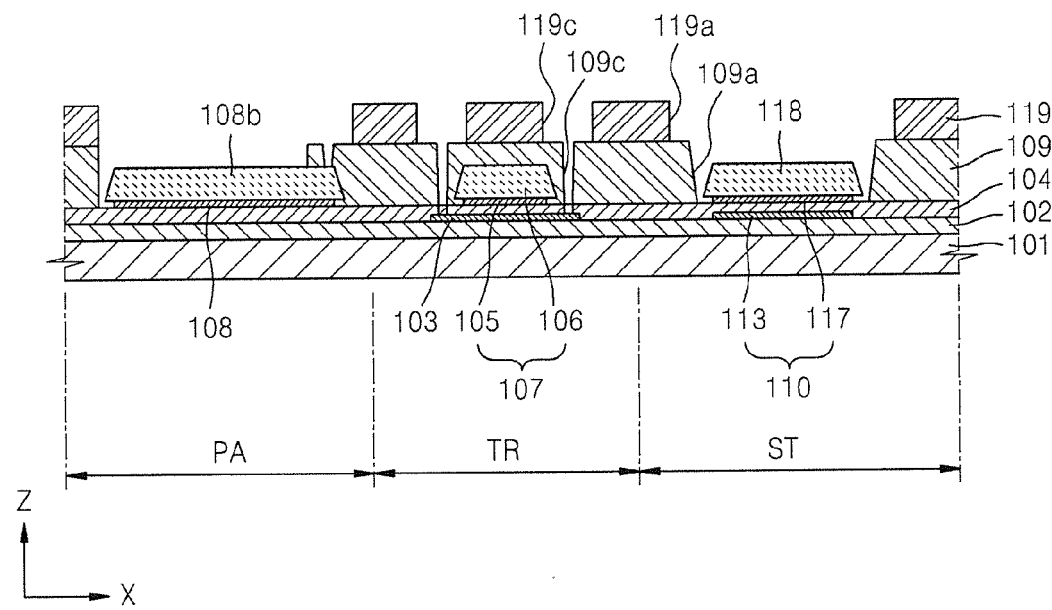

Next, referring to FIG. 3D, the second interlayer insulating layer 119 is formed on the first interlayer insulting layer 109. The second interlayer insulating layer 119 includes a second contact hole 119c connected to the first contact hole 109c. The second contact hole 119c is formed larger than the first contact hole 109c. In particular, when the first interlayer insulating layer 109 is formed of an inorganic material and the second interlayer insulating layer 119 is formed of an organic material, the first contact hole 109c may be easily formed to have a uniform small size, and the second contact hole 119c may be easily formed to be larger than the first contact hole 109c.

Figure 3E:
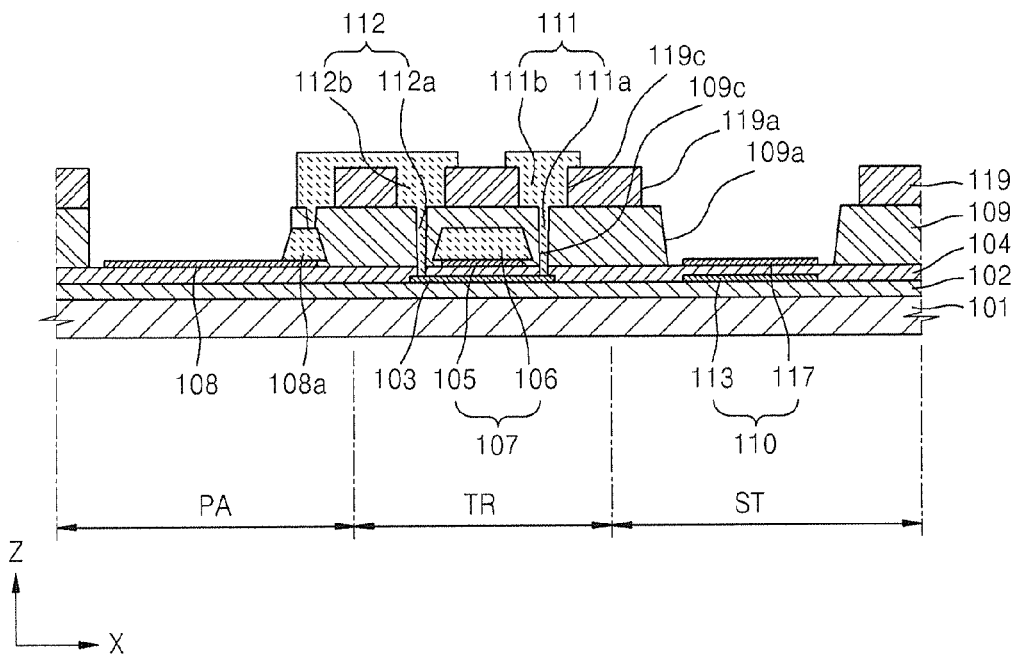

Next, referring to FIG. 3E, a source electrode 111 and a drain electrode 112 are formed. In more detail, a first source electrode layer 111a of the source electrode 111 and a first drain electrode layer 112a of the drain electrode 112 are formed to correspond to the first contact hole 109c of the first interlayer insulating layer 109, and a second source electrode layer 111b of the source electrode 111 and a second drain electrode layer 112b of the drain electrode 112 are formed to correspond to the second contact hole 119c of the second interlayer insulating layer 119. In this case, the first source electrode layer 111a, the first drain electrode layer 112a, the second source electrode layer 111b, and the second drain electrode layer 112b may be simultaneously formed by performing a patterning process using one mask.

Thus, the first source electrode layer 111a and the first drain electrode layer 112a are formed to be smaller than the second source electrode layer 111b and the second drain electrode layer 112b. In addition, a plurality of first source electrode layers 111a are connected to one second source electrode layer 111b, and a plurality of first drain electrode layers 112a are connected to one second drain electrode layer 112b.

In addition, a conductive portion 108a is formed by removing a set or predetermined region of the conductive layer 108b on the first electrode 108, and a top surface of the first electrode 108 is exposed.

Next, the cover layer 118 is removed from an upper portion of the second capacitor electrode 117.

Figure 3F:
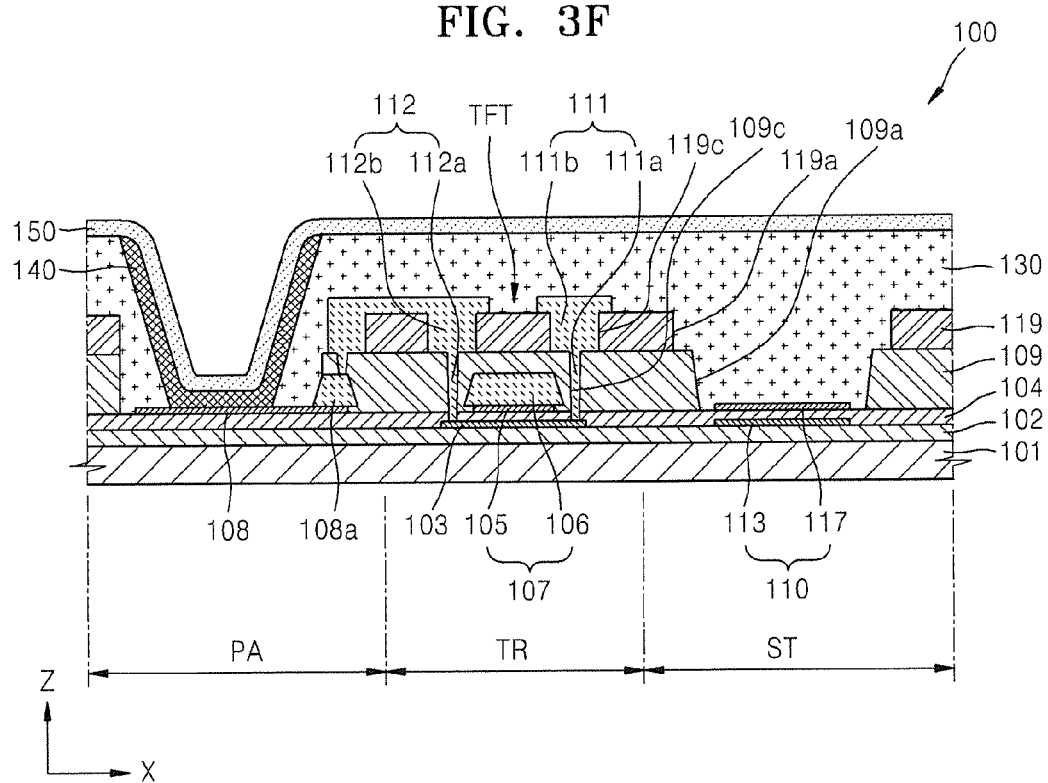

Next, referring to FIG. 3F, a pixel defining layer (PDL) 130 is formed on the second interlayer insulating layer 119 so as to cover the second source electrode layer 111b of the source electrode 111, the second drain electrode layer 112b of the drain electrode 112, and the second capacitor electrode 117. The PDL 130 is formed not to cover at least one region of a top surface of the first electrode 108.

An intermediate layer 140 is formed on the first electrode 108. In more detail, the intermediate layer 140 is formed so as to contact the top surface of the first electrode 108 that is not covered by the PDL 130.

The intermediate layer 140 includes an organic emission layer so as to emit visible light.

A second electrode 150 is formed on the intermediate layer 140, and an encapsulation member may be formed on the second electrode 150.

In the present embodiment, two interlayer insulating layers 109 and 119 are formed before the source electrode 111 and the drain electrode 112 are formed after the gate electrode 107 is formed, so that a short-circuit may be effectively prevented from occurring between the gate electrode 107, the source electrode 111, and the drain electrode 112. Thus, defects in a display quality of the organic light-emitting display device 100 are improved so that a display quality of the organic light-emitting display device 100 may be improved.

In particular, the first contact hole 109c of the first interlayer insulating layer 109 is formed to have a small size so that a distance between the source electrode 111 and the drain electrode 112 and a distance between other wirings are minimized (or can be reduced) so as to easily implement the organic light-emitting display device 100 having high resolution. In addition, the second contact hole 119c of the second interlayer insulating layer 119 is formed larger than the first contact hole 109c so that electrical characteristics of the thin film transistor TFT may be improved.

In this case, a plurality of first contact holes 109c are formed to be connected to one second contact hole 119c so that an electrical contact characteristic between the first source electrode layer 111a and the active layer 103 and an electrical contact characteristic between the first drain electrode layer 112a and the active layer 103 may be easily improved.

Figure 4:
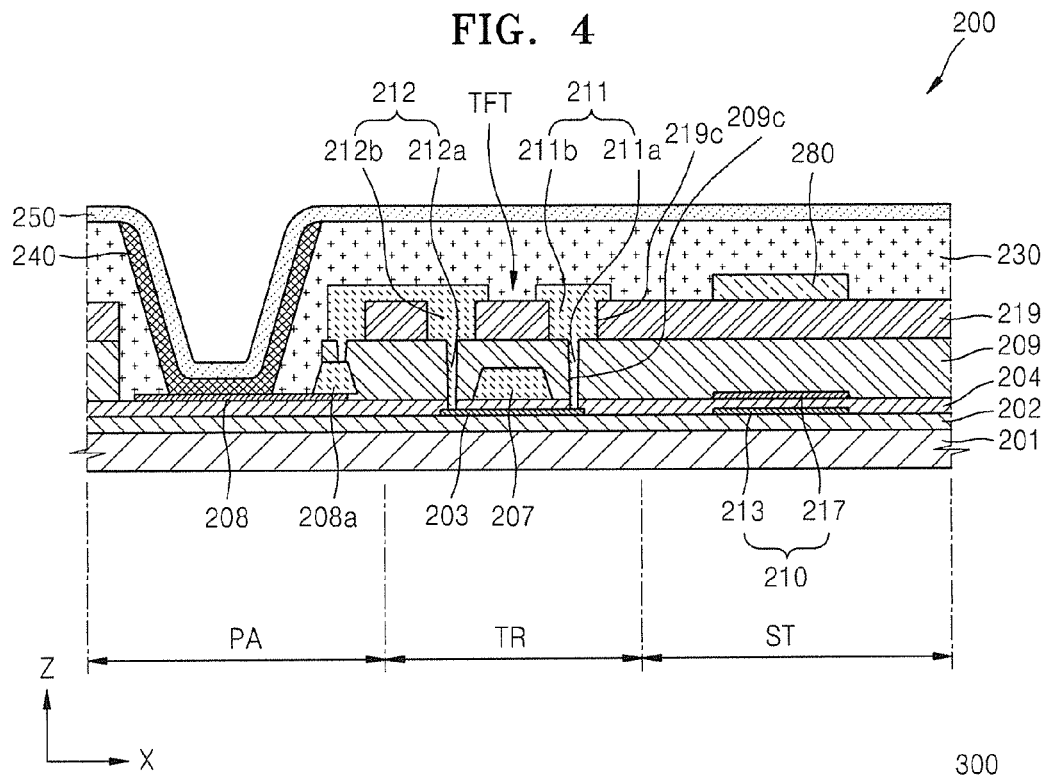
FIG. 4 is a schematic cross-sectional view of an organic light-emitting display device according to another embodiment of the present invention.

FIG. 4 is a schematic cross-sectional view of an organic light-emitting display device 200 according to another embodiment of the present invention.

Referring to FIG. 4, the organic light-emitting display device 200 according to the present embodiment includes a substrate 201, a buffer layer 202, a first electrode 208, a thin film transistor TFT, an intermediate layer 240, a second electrode 250, a first interlayer insulating layer 209, a second interlayer insulating layer 219, a capacitor 210, and a power supply wiring 280.

The substrate 201 is defined by a plurality of areas, which include an emission area PA, a circuit area TR, and a storage area ST.

The emission area PA is an area which overlaps at least the intermediate layer 240 and in which visible light is emitted from the intermediate layer 240. The circuit area TR is an area in which various electrical signals for performing an operation in the emission area PA are transmitted and the thin film transistor TFT is disposed.

The thin film transistor TFT includes an active layer 203, a gate electrode 207, a source electrode 211, and a drain electrode 212. In addition, the source electrode 211 includes a first source electrode layer 211a and a second source electrode layer 211b, and the drain electrode 212 includes a first drain electrode layer 212a and a second drain electrode layer 212b.

The capacitor 210 is disposed in the storage area ST and includes a first capacitor electrode 213 and a second capacitor electrode 217.

Configuration of elements will now be described in more detail. For convenience of explanation, only differences between FIGS. 1 and 2, FIGS. 3A through 3F, and FIG. 4 are described below.

The buffer layer 202 is formed on the substrate 201. The buffer layer 202 prevents or blocks impure elements from penetrating into the substrate 201 and planarizes an upper portion of the substrate 201. The buffer layer 202 may be formed of various materials having such functions. In addition, the buffer layer 202 is not an essential element and thus may be omitted according to process conditions.

The active layer 203 and the first capacitor electrode 213 are formed on the buffer layer 202. The active layer 203 and the first capacitor electrode 213 may be formed of the same material.

A gate insulating layer 204 is formed on the buffer layer 202 so as to cover the active layer 203 and the first capacitor electrode 213.

The gate electrode 207, the first electrode 208, and the second capacitor electrode 217 are formed on the gate insulating layer 204.

The first electrode 208 includes a transmission conductive material and may be formed of the same material used in forming the second capacitor electrode 217. A conductive portion 208a is disposed in a predetermined upper region of the first electrode 208. The conductive portion 208a is formed of the same material used in forming the gate electrode 207.

The first interlayer insulating layer 209 is formed on the first electrode 208, the gate electrode 207, and the second capacitor electrode 217. The first interlayer insulating layer 209 may include various suitable insulating materials, for example, inorganic materials.

The first interlayer insulating layer 209 includes a first contact hole 209c.

In addition, the first interlayer insulating layer 209 is formed to cover the second capacitor electrode 217.

In addition, the first interlayer insulating layer 209 is formed not to cover a set or predetermined region of a top surface of the first electrode 208.

The first source electrode layer 211a of the source electrode 211 and the first drain electrode layer 212a of the drain electrode 212 are formed to correspond to the first contact hole 209c of the first interlayer insulating layer 209.

The first source electrode layer 211a and the first drain electrode layer 212a are formed to be connected to the active layer 203.

The second interlayer insulating layer 219 is formed on the first interlayer insulating layer 209. The second interlayer insulating layer 219 may include various suitable insulating materials, for example, organic materials.

The second interlayer insulating layer 219 includes a second contact hole 219c.

The second interlayer insulating layer 219 is formed to cover the second capacitor electrode 217 and not to cover a predetermined region of the top surface of the first electrode 208.

The second source electrode layer 211b of the source electrode 211 and the second drain electrode layer 212b of the drain electrode 212 are formed to correspond to the second contact hole 219c of the second interlayer insulating layer 219.

The second source electrode layer 211b is connected to the first source electrode layer 211a, and the second drain electrode layer 212b is connected to the first drain electrode layer 212a.

The first source electrode layer 211a of the source electrode 211 is formed smaller than the second source electrode layer 211b. In more detail, the first contact hole 209c of the first interlayer insulating layer 209 is formed smaller than the second contact hole 219c of the second interlayer insulating layer 219, and the first source electrode layer 211a is formed to correspond to the first contact hole 209c, and the second source electrode layer 211b is formed to correspond to the second contact hole 219c. In addition, as previously illustrated in FIG. 2, a plurality of first contact holes 209c are formed to be connected to one second contact hole 219c so that a plurality of first source electrode layers 211a are formed to be connected to the second source electrode layer 211b.

The first drain electrode layer 212a of the drain electrode 212 is formed smaller than the second drain electrode layer 212b. In more detail, the first contact hole 209c of the first interlayer insulating layer 209 is formed smaller than the second contact hole 219c of the second interlayer insulating layer 219, and the first drain electrode layer 212a is formed to correspond to the first contact hole 209c, and the second drain electrode layer 212b is formed to correspond to the second contact hole 219c. In addition, as previously illustrated in FIG. 2, a plurality of first contact holes 209c are formed to be connected to one second contact hole 219c so that a plurality of first drain electrode layers 212a are formed to be connected to the second drain electrode layer 212b.

In addition, one of the source electrode 211 and the drain electrode 212 is electrically connected to the first electrode 208. In FIG. 4, the second drain electrode layer 212b of the drain electrode 212 is electrically connected to the first electrode 208. In more detail, the drain electrode 212 contacts the conductive portion 208a and thus is electrically connected to the first electrode 208.

The power supply wiring 280 is formed on the second interlayer insulating layer 219. The power supply wiring 280 is a wiring for supplying power to the organic light-emitting display device 200 so as to perform an emission operation in the emission area PA. Specifically, the power supply wiring 280 may be a power source ELVDD wiring. The power supply wiring 280 is configured to overlap the capacitor 210 of the storage area ST.

That is, since an additional area, in which the power supply wiring 280 is to be formed, is not required, the aperture ratio of the organic light-emitting display device 200 is increased so as to improve a display quality of the organic light-emitting display device 200.

A PDL 230 is formed on the second interlayer insulating layer 219 so as to cover the second source electrode layer 211b of the source electrode 211, the second drain electrode layer 212b of the drain electrode 212, and the power supply wiring 280. The PDL 230 is formed not to cover at least one region of the top surface of the first electrode 208.

The intermediate layer 240 is formed on the first electrode 208. In more detail, the intermediate layer 240 is formed to contact the top surface of the first electrode 208 that is not covered by the PDL 230.

The intermediate layer 240 includes an organic emission layer so as to emit visible light.

The second electrode 250 is formed on the intermediate layer 240.

Although not shown, an encapsulation member (not shown) may be formed on the second electrode 250. The encapsulation member may be formed using an organic or inorganic material.

In the organic light-emitting display device 200 according to the present embodiment, two interlayer insulating layers 209 and 219 are formed between the gate electrode 207, the second source electrode layer 211*b*, and the second drain electrode layer 212*b* so that a short-circuit may be effectively prevented from occurring between the gate electrode 207, the second source electrode layer 211*b*, and the second drain electrode layer 212*b*. Thus, defects in a display quality of the organic light-emitting display device 200 are improved so as to improve the display quality of the organic light-emitting display device 200.

In particular, the first contact hole 209*c* of the first interlayer insulating layer 209 is formed to have a small size so that a distance between the source electrode 211 and the drain electrode 212 and a distance between other wirings are minimized (or can be reduced) so as to easily implement the organic light-emitting display device 200 having high resolution. In addition, the second contact hole 219*c* of the second interlayer insulating layer 219 is formed larger than the first contact hole 209*c* so that electrical characteristics of the thin film transistor TFT may be improved.

In this case, a plurality of first contact holes 209*c* are formed to be connected to one second contact hole 219*c* so that an electrical contact characteristic between the first source electrode layer 211*a* and the active layer 203 and an electrical contact characteristic between the first drain electrode layer 212*a* and the active layer 203 may be easily improved.

The power supply wiring 280 is formed on the second interlayer insulating layer 219 so as to overlap the capacitor 210 so that an additional space in which the power supply wiring 280 is to be formed, does not need to be formed and the aperture ratio of the organic light-emitting display device 200 may be easily improved and thus the display quality of the organic light-emitting display device 200 may be improved.

Figure 5:
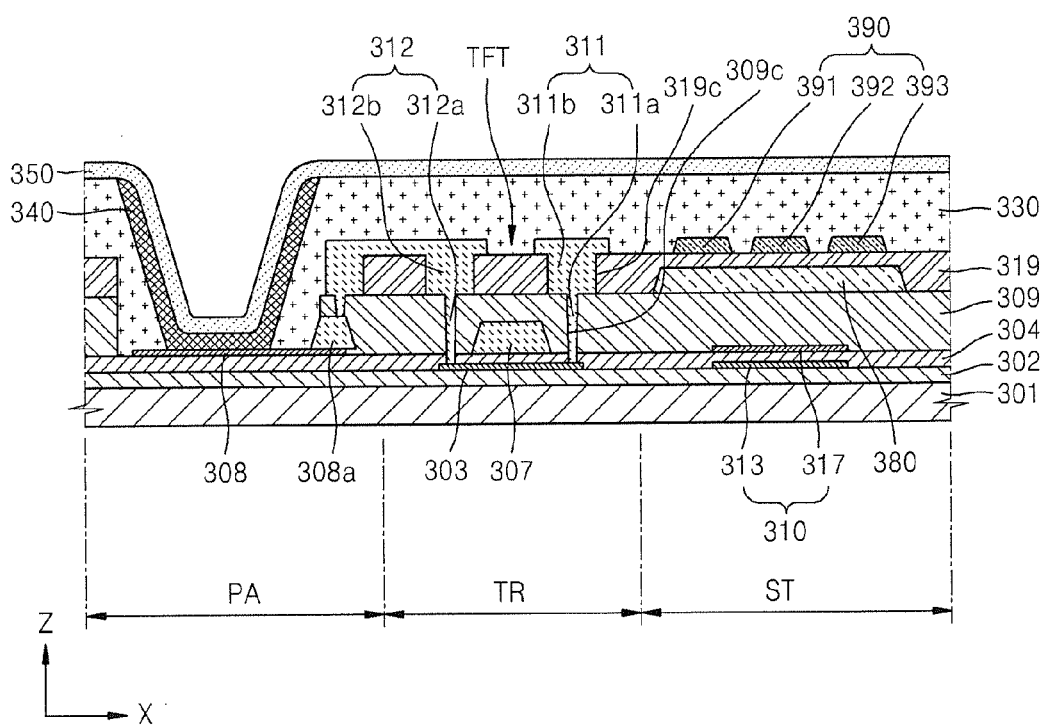
FIG. 5 is a schematic cross-sectional view of an organic light-emitting display device according to another embodiment of the present invention.

FIG. 5 is a schematic cross-sectional view of an organic light-emitting display device 300 according to another embodiment of the present invention.

Referring to FIG. 5, the organic light-emitting display device 300 according to the present embodiment includes a substrate 301, a buffer layer 302, a first electrode 308, a thin film transistor TFT, an intermediate layer 340, a second electrode 350, a first interlayer insulating layer 309, a second interlayer insulating layer 319, a capacitor 310, a power supply wiring 380, and a data wiring 390.

The substrate 301 is defined by a plurality of areas, which include an emission area PA, a circuit area TR, and a storage area ST.

The emission area PA is an area which overlaps at least the intermediate layer 340 and in which visible light is emitted from the intermediate layer 340. The circuit area TR is an area in which various electrical signals for performing an operation in the emission area PA are transmitted and the thin film transistor TFT is disposed.

The thin film transistor TFT includes an active layer 303, a gate electrode 307, a source electrode 311, and a drain electrode 312. In addition, the source electrode 311 includes a first source electrode layer 311*a* and a second source electrode layer 311*b*, and the drain electrode 312 includes a first drain electrode layer 312*a* and a second drain electrode layer 312*b*.

The capacitor 310 is disposed in the storage area ST. The capacitor 310 includes a first capacitor electrode 313 and a second capacitor electrode 317.

Configuration of elements will now be described in more detail. For convenience of explanation, only differences between FIGS. 1 and 2, FIGS. 3A through 3F, FIG. 4, and FIG. 5 are described.

The buffer layer 302 is formed on the substrate 301. The buffer layer 302 prevents or blocks impure elements from penetrating into the substrate 301 and planarizes an upper portion of the substrate 301. The buffer layer 302 may be formed of various suitable materials having such functions. In addition, the buffer layer 302 is not an essential element and thus may be omitted according to process conditions.

The active layer 303 and the first capacitor electrode 313 are formed on the buffer layer 302. The active layer 303 and the first capacitor electrode 313 may be formed of the same material.

A gate insulating layer 304 is formed on the buffer layer 302 so as to cover the active layer 303 and the first capacitor electrode 313.

The gate electrode 307, the first electrode 308, and the second capacitor electrode 317 are formed on the gate insulating layer 304.

The first electrode 308 includes a transmission conductive material and may be formed of the same material used in forming the second capacitor electrode 317. A conductive portion 308*a* is disposed in a set or predetermined upper region of the first electrode 308. The conductive portion 308*a* is formed of the same material used in forming the gate electrode 307.

The first interlayer insulating layer 309 is formed on the first electrode 308, the gate electrode 307, and the second capacitor electrode 317. The first interlayer insulating layer 309 may include various insulating materials, for example, inorganic materials.

The first interlayer insulating layer 309 includes a first contact hole 309*c*.

In addition, the first interlayer insulating layer 309 is formed to cover the second capacitor electrode 317.

In addition, the first interlayer insulating layer 309 is formed not to cover a set or predetermined region of a top surface of the first electrode 308.

The first source electrode layer 311*a* of the source electrode 311 and the first drain electrode layer 312*a* of the drain electrode 312 are formed to correspond to the first contact hole 309*c* of the first interlayer insulating layer 309.

The first source electrode layer 311*a* and the first drain electrode layer 312*a* are formed to be connected to the active layer 303.

In addition, the power supply wiring 380 is formed on the first interlayer insulating layer 309. The power supply wiring 380 is a wiring for supplying power to the organic light-emitting display device 300 so as to perform an emission operation in the emission area PA. Specifically, the power supply wiring 380 may be a power source ELVDD wiring. The power supply wiring 380 overlaps the capacitor 310 of the storage area ST.

That is, since an additional area in which the power supply wiring 380 is to be formed, is not required, the aperture ratio of the organic light-emitting display device 300 may be increased to improve a display quality of the organic light-emitting display device 300.

The second interlayer insulating layer 319 is formed on the first interlayer insulating layer 309. The second interlayer insulating layer 319 may include various suitable insulating materials, for example, organic materials.

The second interlayer insulating layer 319 includes a second contact hole 319*c*.

The second interlayer insulating layer 319 is formed to cover the power supply wiring 380 and not to cover a set or predetermined region of a top surface of the first electrode 308.

The second source electrode layer 311b of the source electrode 311 and the second drain electrode layer 312b of the drain electrode 312 are formed to correspond to the second contact hole 319c of the second interlayer insulating layer 319.

The second source electrode layer 311b is connected to the first source electrode layer 311a, and the second drain electrode layer 312b is connected to the first drain electrode layer 312a.

The first source electrode layer 311a of the source electrode 311 is formed smaller than the second source electrode layer 311b. In more detail, the first contact hole 309c of the first interlayer insulating layer 309 is formed smaller than the second contact hole 319c of the second interlayer insulating layer 319, and the first source electrode layer 311a is formed to correspond to the first contact hole 309c, and the second source electrode layer 311b is formed to correspond to the second contact hole 319c. In addition, as previously illustrated in FIG. 2, a plurality of first contact holes 309c are formed to be connected to one second contact hole 319c so that a plurality of first source electrode layers 311a are formed to be connected to the second source electrode layer 311b.

The first drain electrode layer 312a of the drain electrode 312 is formed smaller than the second drain electrode layer 312b. In more detail, the first contact hole 309c of the first interlayer insulating layer 309 is formed smaller than the second contact hole 319c of the second interlayer insulating layer 319, and the first drain electrode layer 312a is formed to correspond to the first contact hole 309c, and the second drain electrode layer 312b is formed to correspond to the second contact hole 319c. In addition, as previously illustrated in FIG. 2, a plurality of first contact holes 309c are formed to be connected to one second contact hole 319c so that a plurality of first drain electrode layers 312a are formed to be connected to the second drain electrode layer 312b.

In addition, one of the source electrode 311 and the drain electrode 312 is electrically connected to the first electrode 308. In FIG. 5, the second drain electrode layer 312b of the drain electrode 312 is electrically connected to the first electrode 308. In more detail, the drain electrode 312 contacts the conductive portion 308a and thus is electrically connected to the first electrode 308.

The data wiring 390 is formed on the second interlayer insulating layer 319. The data wiring 390 transmits data signals output from a data driving unit (not shown) to the emission area PA. The data wiring 390 overlaps the capacitor 310 of the storage area ST. In addition, the data wiring 390 overlaps the power supply wiring 380.

In FIG. 5, the data wiring 390 includes a first data wiring 391, a second data wiring 392, and a third data wiring 393. The data wiring 390 corresponds to one pixel. The first data wiring 391, the second data wiring 392, and the third data wiring 393 correspond to a plurality of sub pixels disposed in one pixel.

However, aspects of the present invention are not limited thereto, and a data wiring corresponding to one sub pixel may be formed to correspond to the capacitor 310 and the power supply wiring 380.

In addition, in another alternative embodiment, the data wiring 390 may be formed on the first interlayer insulating layer 309, and the power supply wiring 380 may be formed on the second interlayer insulating layer 319.

A PDL 330 is formed on the second interlayer insulating layer 319 so as to cover the second source electrode layer 311b of the source electrode 311, the second drain electrode layer 312b of the drain electrode 312, and the data wiring 390. The PDL 330 is formed not to cover at least one region of the top surface of the first electrode 308.

The intermediate layer 340 is formed on the first electrode 308. In more detail, the intermediate layer 340 is formed to contact the top surface of the first electrode 308 that is not covered by the PDL 330.

The intermediate layer 340 includes an organic emission layer so as to emit visible light.

The second electrode 350 is formed on the intermediate layer 340.

Although not shown, an encapsulation member may be formed on the second electrode 350. The encapsulation member may be formed using an organic or inorganic material.

In the organic light-emitting display device 300 illustrated in FIG. 5, two interlayer insulating layers 309 and 319 are formed between the gate electrode 307, the second source electrode layer 311b, and the second drain electrode layer 312b so that a short-circuit may be effectively prevented from occurring between the gate electrode 307, the second source electrode layer 311b, and the second drain electrode layer 312b. Thus, defects in a display quality of the organic light-emitting display device 300 are improved so that the display quality of the organic light-emitting display device 300 may be improved.

In particular, the first contact hole 309c of the first interlayer insulating layer 309 is formed to have a small size so that a distance between the source electrode 311 and the drain electrode 312 and a distance between other wirings are minimized (or can be reduced) so as to easily implement the organic light-emitting display device 300 having high resolution. In addition, the second contact hole 319c of the second interlayer insulating layer 319 is formed larger than the first contact hole 309c so that electrical characteristics of the thin film transistor TFT may be improved.

In this case, a plurality of first contact holes 309c are formed connected to one second contact hole 319c so that an electrical contact characteristic between the first source electrode layer 311a and the active layer 303 and an electrical contact characteristic between the first drain electrode layer 312a and the active layer 303 may be easily improved.

The power supply wiring 380 is formed on the first interlayer insulating layer 309 so as to overlap the capacitor 310 so that an additional space, in which the power supply wiring 380 is to be formed, is not required so that the aperture of the organic light-emitting display device 300 may be easily improved so as to improve the display quality of the organic light-emitting display device 300.

In addition, the data wiring 390 is formed on the second interlayer insulating layer 319 so as to overlap the capacitor 310 so that an additional space, in which the data wiring 390 is to be formed, does not need to be formed so that the aperture ratio of the organic light-emitting display device 300 may be easily improved so as to improve the display quality of the organic light-emitting display device 300. In particular, the data wiring 390 overlaps the capacitor 310 and the power supply wiring 380 so that the display quality of the organic light-emitting display device 300 may be remarkably improved.

As described above, in an organic light-emitting display device and a method of manufacturing the organic light-emitting display device according to the one or more embodiments of the present invention, a display quality of the organic light-emitting display device may be easily improved.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting display device comprising:
    a substrate;
    an active layer on the substrate;
    a gate electrode insulated from the active layer and overlapping the active layer;
    a source electrode comprising a first source electrode layer connected to the active layer and a second source electrode layer connected to the first source electrode layer, the second source electrode layer being larger than the first source electrode layer;
    a drain electrode comprising a first drain electrode layer connected to the active layer and a second drain electrode layer connected to the first drain electrode layer, the second drain electrode layer being larger than the first drain electrode layer;
    a first electrode electrically connected to the source electrode or the drain electrode;
    an intermediate layer on the first electrode and comprising an organic emission layer;
    a second electrode on the intermediate layer;
    a first interlayer insulating layer on the gate electrode and comprising a first contact hole; and
    a second interlayer insulating layer on the first interlayer insulating layer and comprising a second contact hole,
    wherein a plurality of the first contact holes are formed to be connected to a same second contact hole, and extend through the first interlayer insulating layer to the same second contact hole.

2. The organic light-emitting display device of claim 1, wherein the first source electrode layer and the first drain electrode layer are formed to correspond to the first contact hole, and
    the second source electrode layer and the second drain electrode layer are formed to correspond to the second contact hole.

3. The organic light-emitting display device of claim 1, wherein the first contact hole has a size smaller than that of the second contact hole.

4. The organic light-emitting display device of claim 1, wherein the first interlayer insulating layer comprises an inorganic material, and the second interlayer insulating layer comprises an organic material.

5. The organic light-emitting display device of claim 1, wherein a top surface of the second interlayer insulating layer is planarized.

6. The organic light-emitting display device of claim 1, further comprising:
    a storage area defined on the substrate, and
    a capacitor in the storage area and comprising a first capacitor electrode and a second capacitor electrode.

7. The organic light-emitting display device of claim 6, wherein each of the first interlayer insulating layer and the second interlayer insulating layer further comprises an opening corresponding to the capacitor.

8. The organic light-emitting display device of claim 6, further comprising a power supply wiring formed above the capacitor so as to overlap the capacitor.

9. The organic light-emitting display device of claim 8, wherein at least one insulating layer is disposed between the capacitor and the power supply wiring.

10. The organic light-emitting display device of claim 8, wherein the first interlayer insulating layer and the second interlayer insulating layer are disposed between the capacitor and the power supply wiring.

11. The organic light-emitting display device of claim 6, further comprising a data wiring formed above the capacitor so as to overlap the capacitor.

12. The organic light-emitting display device of claim 11, wherein at least one insulating layer is disposed between the capacitor and the data wiring.

13. The organic light-emitting display device of claim 11, wherein the first interlayer insulating layer and the second interlayer insulating layer are disposed between the capacitor and the data wiring.

14. The organic light-emitting display device of claim 6, further comprising
    a power supply wiring and a data wiring formed above the capacitor so as to overlap the capacitor,
    wherein the power supply wiring and the data wiring are formed as different layers so as to overlap each other.

15. The organic light-emitting display device of claim 14, wherein the power supply wiring is on the first interlayer insulating layer, and the data wiring is on the second interlayer insulating layer.

16. The organic light-emitting display device of claim 14, wherein the data wiring is on the first interlayer insulating layer, and the power supply wiring is on the second interlayer insulating layer.

17. The organic light-emitting display device of claim 6, wherein the first
    capacitor electrode is on the same layer as the active layer, and
    the second capacitor electrode is on the same layer as the gate electrode.

18. The organic light-emitting display device of claim 1, wherein the first electrode comprises ITO, IZO, ZnO, $In_2O_3$, IGO, or AZO.

19. The organic light-emitting display device of claim 1, wherein the first electrode is on the same layer as the gate electrode.

20. The organic light-emitting display device of claim 1, wherein the gate
    electrode comprises a first conductive layer and a second conductive layer on the first conductive layer, and
    the first electrode is formed on the same layer as the first conductive layer by using the same material used in forming the first conductive layer.

21. The organic light-emitting display device of claim 1, wherein a surface of the second source electrode layer facing the first source electrode layer has a larger area than that of a surface of the first source electrode layer facing the second source electrode layer.

22. A method of manufacturing an organic light-emitting display device, the method comprising:
    forming an active layer on a substrate;
    forming a gate electrode insulated from the active layer and overlapping the active layer;
    forming a source electrode comprising a first source electrode layer connected to the active layer and a second source electrode layer connected to the first source electrode layer, the second source electrode being larger than the first source electrode layer;
    forming a drain electrode comprising a first drain electrode layer that is connected to the active layer and a second drain electrode layer connected to the first drain electrode layer, the second drain electrode layer being larger than the first drain electrode layer;

forming a first electrode electrically connected to the source electrode or the drain electrode;

forming an intermediate layer on the first electrode to comprise an organic emission layer;

forming a second electrode on the intermediate layer;

forming a first interlayer insulating layer on the gate electrode, wherein the first interlayer insulating layer comprises a first contact hole; and forming a second interlayer insulating layer on the first interlayer insulating layer, wherein the second interlayer insulating layer comprises a second contact hole, and wherein a plurality of the first contact holes are formed to be connected to a same second contact hole, and extend through the first interlayer insulating layer to the same second contact hole.

23. The method of claim 22, wherein, each of the forming of the source electrode and the forming of the drain electrode comprises forming the first source electrode layer and the first drain electrode layer so as to correspond to the first contact hole and forming the second source electrode layer and the second drain electrode layer so as to correspond to the second contact hole.

24. The method of claim 23, wherein, each of the forming of the source electrode and the forming of the drain electrode comprises concurrently forming the first source electrode layer, the first drain electrode layer, the second source electrode layer, and the second drain electrode layer after the forming of the first interlayer insulating layer and the forming of the second interlayer insulating layer.

* * * * *